(12) United States Patent
Matsuyama

(10) Patent No.: US 7,994,035 B2
(45) Date of Patent: Aug. 9, 2011

(54) SEMICONDUCTOR DEVICE FABRICATING METHOD INCLUDING THERMAL OXIDATION OF A SUBSTRATE, FORMING A SECOND OXIDE, AND THERMAL PROCESSING A GATE ELECTRODE

(75) Inventor: Isamu Matsuyama, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 63 days.

(21) Appl. No.: 12/320,714

(22) Filed: Feb. 3, 2009

(65) Prior Publication Data
US 2009/0227098 A1    Sep. 10, 2009

(30) Foreign Application Priority Data

Mar. 5, 2008  (JP) .................................. 2008-055045

(51) Int. Cl.
*H01L 21/3205* (2006.01)
*H01L 21/4763* (2006.01)
*H01L 21/31* (2006.01)
*H01L 21/469* (2006.01)
(52) U.S. Cl. ........................................ 438/585; 438/787
(58) Field of Classification Search .................. 438/585, 438/787; 257/E21.495
See application file for complete search history.

(56) References Cited

U.S. PATENT DOCUMENTS
5,592,002 A * 1/1997 Kanamori ..................... 257/321

FOREIGN PATENT DOCUMENTS

| JP | 1-196129 | 8/1989 |
| JP | 10-70273 | 3/1998 |
| JP | 2002-151680 | 5/2002 |
| JP | 2003-347548 | 12/2003 |
| JP | 2007-180118 | 7/2007 |
| JP | 2007-201343 | 8/2007 |
| JP | 2007-201343 | * 9/2007 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 175-178.*
Kazuo Arai and Sadafumi Yoshida, "Fundamentals and Applications of SiC Devices", Ohmsha, Sep. 30, 2003, pp. 29 to 32.

* cited by examiner

*Primary Examiner* — William M. Brewster
(74) *Attorney, Agent, or Firm* — Rabin & Berdo, PC

(57) ABSTRACT

There is provided a method of fabricating a semiconductor device in which a gate electrode is formed on an oxide film, which is formed by thermal oxidation on a substrate. The fabrication method includes: a first step of forming a first oxide film on the substrate; a second step of thermally processing the first oxide film in an inactive gas atmosphere; a third step of forming a second oxide film that is obtained by etching the first oxide film, which has been thermally processed in the inactive gas, to a predetermined film thickness; and a fourth step of forming and thermally processing a gate electrode on the second oxide film.

11 Claims, 8 Drawing Sheets

SEMICONDUCTOR DEVICE FABRICATING METHOD INCLUDING THERMAL OXIDATION OF A SUBSTRATE, FORMING A SECOND OXIDE, AND THERMAL PROCESSING A GATE ELECTRODE

CROSS-REFERENCE TO RELATED APPLICATION

This application claims priority under 35 USC 119 from Japanese Patent Application No. 2008-055045, the disclosure of which is incorporated by reference herein.

BACKGROUND OF THE INVENTION

1. Field of the Invention

The present invention relates to a method of fabricating a semiconductor device, and more particularly to a semiconductor device fabrication method that includes a step of forming a gate oxide film.

2. Description of Related Art

Ordinarily, a semiconductor device that employs silicon carbide crystal is characterized by having a larger energy gap, a larger thermal conductivity, a higher insulation breakdown field strength, and a greater saturated electron drift velocity and suchlike than a conventional semiconductor device that employs silicon crystal. As a result, the application of semiconductor devices that employ silicon carbide crystals as power devices has been foreseen (see, for example, Kazuo Arai and Sadafumi Yoshida, "Fundamentals and Applications of SiC Devices", Ohmsha, Sep. 30, 2003, pp. 29 to 32). Furthermore, in semiconductor devices that employ silicon carbide crystals, similarly to cases in which silicon crystals are employed, PN-type control is easy, and it is possible to manufacture a thermal oxidation silicon dioxide film, to form a gate oxide film (silicon dioxide film) to serve as an electrode by thermal oxidation of polysilicon doped with P (phosphorus), or the like. Thus, the same processes as when silicon crystals are employed may be applied. Therefore, by replacing silicon crystal with silicon carbide crystal, limits on various device capabilities of conventional semiconductor devices may be raised, and high-performance semiconductor devices may be manufactured.

As methods for forming an oxide film on a silicon carbide substrate, technologies of thermally processing the substrate in an oxidizing atmosphere have been proposed, such as dry oxidation, which is thermal oxidation in an atmosphere of oxygen $O_2$, a wet oxidation method, which is thermal oxidation in an atmosphere in which a small quantity of water vapor $H_2O$ has been added to $O_2$, and the like (see, for example, Japanese Patent Application Laid-Open (JP-A) No. 2007-201343 or the like).

However, a silicon carbide substrate differs from a silicon substrate in being a compound of silicon Si and carbon C, and thus fundamentally including carbon as a constituent element. Therefore, it can be understood that carbon that is left in oxide films manufactured in accordance with various oxide film formation conditions affects electronic characteristics, and cases in which oxide films are formed on silicon carbide substrates have problems with interface states, fixed charges and the like. With a 4H-silicon carbide substrate, optimum oxidation conditions vary in accordance with surface orientation. For a silicon surface, dry oxidation at around 1300° C., post-annealing with argon, and $H_2$-annealing are effective to form the gate oxide film with less interface traps and fixed charges. $N_2O$ oxidation at 1350° C. or the like is also effective. For a carbon surface, wet oxidation at around 1000° C. is effective.

However, when the same conditions are evaluated with a 3C-silicon carbide substrate, the characteristics are closer to a carbon surface of 4H-silicon carbide, with fixed charges being very numerous with dry oxidation but wet oxidation being effective.

Generally, after a gate electrode is formed, for example, of polysilicon on an oxide film, thermal processing is carried out in order to activate the gate electrode. However, carbon at an interface between the silicon carbide substrate and the gate oxide film will be segregated by this thermal processing. Because of this segregated carbon, interface states are increased and/or positive fixed charges are generated, and as a result a flat band voltage is negatively shifted. Even if the oxide film (gate oxide film) has been formed by wet oxidation as described above, although the amount of shift of a dry oxidation flat band voltage is small, the negative shifting also occurs.

Now, an example of evaluation of CV characteristics is shown in FIG. 6. A gate oxide film is formed by thermal oxidation of a silicon carbide substrate in a wet oxidation atmosphere in a diffusion furnace. Thereon, a polysilicon layer doped with phosphorus to a high density of around $5 \times 10^{20}/cm^3$ is formed by CVD, a semiconductor device (a MOS capacitor) is formed, and the CV characteristic thereof is evaluated. From FIG. 6, the flat band voltage (Vfb) is around −13 V The threshold (Vt) of a lateral MOS device fabricated by practical application of the conditions of formation of a polysilicon gate electrode with this CV characteristic is −0.5 V, as shown in FIG. 7. The formation of gate oxide film and gate electrode of a MOS capacitor shown in FIG. 6 are applied in the same manner to the device illustrated in FIG. 7, and the CV characteristics exemplify evaluation results of individual gate oxide films of FIG. 7.

Even in a state in which a gate voltage is not applied thus, the current flows in the semiconductor device, and a "normally off" device may not be fabricated.

Generally, even though Vfb is a negative value, if the absolute value of Vfb is small, then the threshold may be adjusted to shift to the positive side by injection of phosphorus or the like into the substrate. However, if the amount of shifting would be large, treatment by this method is not possible.

SUMMARY OF THE INVENTION

The present invention has been made in consideration of the above problem and is intended to achieve the following objective. That is, an object of the present invention is to provide a semiconductor device fabrication method that suppresses a shift of a threshold to the negative side when thermal processing is carried out in order to activate polysilicon employed in a gate electrode.

The present inventors have carried out diligent investigations and as a result have managed to discover that it is possible to solve the above-described problem and achieve the above-described objective by employing the following semiconductor device fabrication method.

That is, the present invention provides a method of fabricating a semiconductor device in which a gate electrode is provided on an oxide film, which is formed by thermal oxidation on a substrate, the method including:

(i) forming a first oxide film on the substrate;

(ii) thermally processing the first oxide film in an inactive gas atmosphere;

(iii) forming a second oxide film by etching the first oxide film, which has been thermally processed in the inactive gas, to a predetermined film thickness; and (iv) forming and thermally processing the gate electrode on the second oxide film.

Further, the semiconductor device fabrication method of the present invention is characterized by the processing temperature in the second step being not less than the processing temperature in the fourth step and not more than the substrate temperature in the first step.

According to the present invention, a semiconductor device fabrication method may be provided that suppresses a shift of a threshold to the negative side even when thermal processing is carried out in order to activate a gate electrode.

BRIEF DESCRIPTION OF THE DRAWINGS

Preferred exemplary embodiments of the present invention will be described in detail based on the following figures, wherein.

DETAILED DESCRIPTION OF THE INVENTION

Figure 1A:
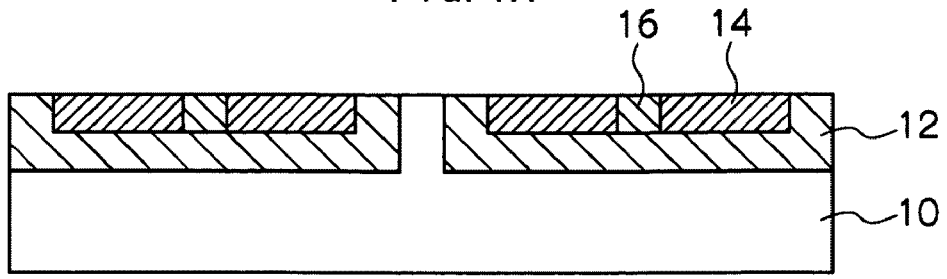
FIGS. 1A-1D are sectional process views of steps, of a semiconductor device fabrication method relating to an exemplary embodiment of the present invention, of forming a diffusion layer in a silicon carbide substrate and then forming a gate electrode film.

Herebelow, referring to the drawings, the semiconductor device fabrication method of the present invention, and evaluation of a semiconductor device fabricated by this fabrication method, will be described. In the drawings, shapes, sizes and positional relationships of respective constituent portions are illustrated schematically merely to an extent such that the invention may be understood, and the invention is not to be particularly limited in accordance therewith. In the following descriptions, particular materials, conditions, numerical conditions and the like may be utilized, but this is merely a preferable example and the invention is in no way limited in accordance therewith. Moreover, in regard to an electric conduction type, a example employing an N-type silicon carbide substrate is presented, but P-type is also available. The same applies to diffusion layers.

In the semiconductor device fabrication method of the present invention, during thermal oxidation of the substrate, carbon atoms that are present in the substrate or in the atmosphere are left in an oxide film that is formed by the thermal oxidation, and function as electrically active fixed charges. Therefore, a region of the oxide film in which many carbon atoms are left can be removed by the present invention.

With the present invention, an effect is particularly exhibited if a silicon carbide substrate, which is excellent in the characteristics of semiconductor devices and contains many carbon atoms, is employed. A large proportion of the carbon atoms that are left in the oxide film formed by the thermal oxidation may be removed. Accordingly, fixed charges are suppressed and the flat band voltage may be reduced. Therefore, a semiconductor device may be fabricated in which a shift to the negative side that is caused by thermal processing for activating a gate electrode is suppressed.

For the present invention, the meaning of the term "predetermined film thickness" includes film thicknesses such that specifications of a semiconductor device are satisfied, and is not to be particularly limited.

<Method of Fabricating Semiconductor Device>

First Step: A Step of Forming a Thermal Oxide Film on a Substrate

Firstly, as in FIG. 1A, various impurities are implanted into a surface layer region of an N-type silicon carbide substrate 10 which has been doped with nitrogen to around $1 \times 10^{16}/cm^3$, and a P-type diffusion layer 12, an $N^+$ diffusion layer 14 and a $P^+$ diffusion layer 16 are formed. For example, aluminum ions are injected into the P-type diffusion layer 12 and the $P^+$ diffusion layer 16 or the like, and phosphorus is injected into the $N^+$ diffusion layer (a source region of a MOSFET). An implantation method may be, for example, a conventional solid state diffusion method, vapor phase diffusion method or ion implantation method. Thereafter, the impurities are activated and crystallinity of the substrate is restored by, for example, processing for a duration from several minutes to 60 minutes at a temperature of around 1500° C. to 1700° C. in an argon atmosphere or a vacuum of not more than $1 \times 10^{-5}$ Pa or the like.

Figure 1B:
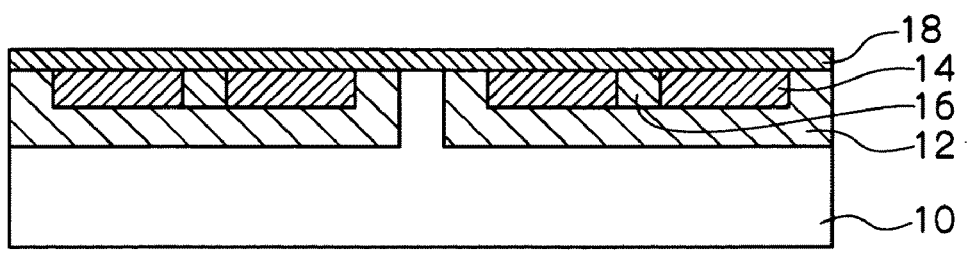

Then, as in FIG. 1B, a first oxide film 18, which is thicker than a predetermined film thickness that is to result from thermal oxidation (below referred to where appropriate as the "specified film thickness"), is formed at the surface of the silicon carbide substrate 10. The first oxide film 18 is formed of silicon dioxide ($SiO_2$).

Conditions of the thermal oxidation are that, for example, processing is carried out for 0.25 hours to 2 hours at a temperature of 1050° C. to 1250° C. in an oxygen ($O_2$) atmosphere at atmospheric pressure (below referred to where appropriate as a dry atmosphere), employing a conventional diffusion furnace. The processing duration of the thermal oxidation may be prolonged in order to adjust the first oxide film 18 to the specified thickness. In the present exemplary embodiment, a film thickness of a second gate oxide film 19, which includes a later-mentioned predetermined film thickness, is 55 nm, and a film thickness of an oxide film 21, which is subjected to later-described etching removal, is 20 nm. A method for determining the film thickness of the oxide film to be removed by etching 21 will be described below. The above-mentioned specified film thickness represents a sum of film thicknesses of the second gate oxide film 19, including the later-described predetermined film thickness, and the oxide film 21 that is to be subjected to the later-described etching removal.

A method of forming the oxide film by thermal oxidation may be, beside the dry oxidation method of thermal oxidation in a pure oxygen atmosphere as described above, forming the oxide film by a pyrogenic oxidation method—combusting oxygen and hydrogen in a combustion chamber, adding pure water vapor ($H_2O$) to an atmosphere gas, flowing the same into a reaction chamber and causing thermal oxidation—or a "wet oxidation" method.

Figure 1C:
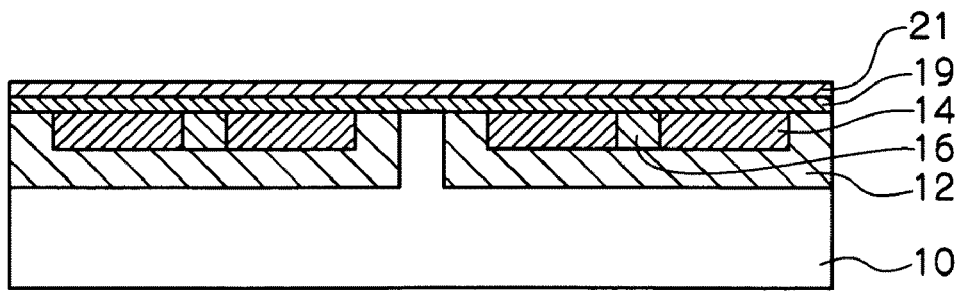

Second Step: A Step of Performing Thermal Processing of the First Oxide Film in an Inactive Gas Atmosphere Then, as in FIG. 1C, thermal processing of the above-described first oxide film 18 is carried out in an inactive gas, remaining carbon atoms are segregated, and the oxide film to be removed by etching 21 is formed. The inactive gas may be, for example, argon (Ar), helium (He) or $N_2$. $N_2$ is preferable, being ordinarily widely used in semiconductor processes and also being inexpensive.

The thermal processing temperature is preferably not less than a thermal processing temperature in a fourth step, which is described below, and not more than a substrate temperature in the first step. When the thermal processing temperature is at or above the thermal processing temperature of the fourth step, segregation of carbon atoms in the oxide film by the thermal processing of the fourth step may be prevented. The lower limit, the thermal processing temperature of the fourth step, is preferably 700 to 900° C., with regard to activation of P (phosphorus) that has been doped into polysilicon which is employed as a gate electrode. Meanwhile, by the upper limit being set to the substrate temperature of the first step, when, for example, polysilicon is employed as the gate electrode, revaporization of dopants in the polysilicon may be avoided and electric performance of the polysilicon layer such as low resistivity may be maintained. If the thermal processing temperature is higher than the substrate temperature of the first step, an optimum temperature for activation will be exceeded, phosphorus in the polysilicon will vaporize, and the phosphorus density will become smaller. Consequently, a contact resistance of the electrode will be higher and effects on electronic characteristics will be a concern, which is not preferable. The thermal processing temperature of the present invention refers to a thermal processing retention temperature experienced by the substrate. Specifically, as an example, the thermal processing temperature of the second step may be 850° C. and the thermal processing temperature in the fourth step 800° C.

The thermal processing duration of the second step may be any duration such that the carbon atoms segregate, and thermal processing in a range of 30 minutes to 2 hours is preferable.

Figure 2:
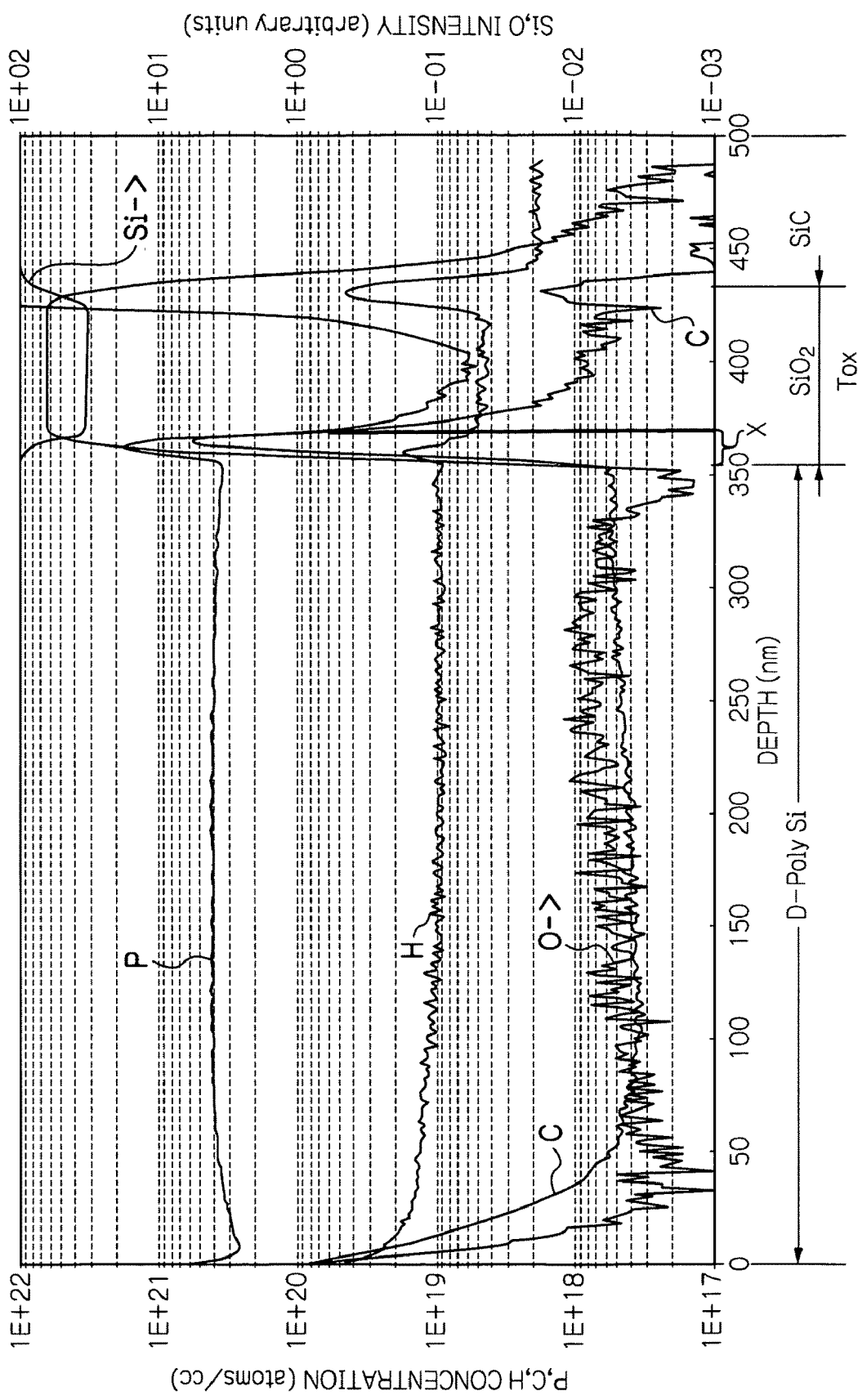
FIG. 2 is a graph showing results of SIMS analysis of density distributions of phosphorus, hydrogen, carbon, silicon and oxygen in a semiconductor device (a MOS capacitor structure) which, in a conventional semiconductor device fabrication method, has been thermally processed for 1 hour at 800° C. in an $N_2$ atmosphere after a polysilicon electrode has been formed on an oxide film formed in a dry atmosphere.

FIG. 2 shows results of SIMS analysis of a MOS capacitor structure manufactured using a conventional process. Polysilicon electrodes are fabricated by being formed, as described below, on an oxide film formed by a dry oxidation method and being thermally processed for 1 hour at 800° C. in an $N_2$ atmosphere. For this semiconductor device, density distribution SIMS analysis results are shown for phosphorus, hydrogen, carbon, silicon and oxygen. As shown in the graph, it is clear that there are many carbon atoms present at the interface between the gate oxide film ($SiO_2$) and the polysilicon (D-Poly Si). From this result, it is understood that the carbon atoms are a cause of the flat band voltage shifting to the negative side as in the earlier-described FIG. 6.

With a view to suppressing the shift in the flat band voltage, the film thickness of the oxide film to be removed by etching 21 is preferably set to a thickness such that an inclusion amount of carbon atoms in the above-described first oxide film will be $1/10$ of a maximum value. Specifically, from FIG. 2, the carbon inclusion amount has a maximum value of $6 \times 10^{20}$ atoms/cc. Therefore, it is sufficient to remove the oxide film until a thickness at which the carbon inclusion amount is $6 \times 10^{19}$ atoms/cc. Thus, in order to remove a region of the oxide film in which many carbon atoms are present, the film thickness of the oxide film to be removed by etching 21 will be 20 nm for FIG. 2. This film thickness of the oxide film to be removed by etching 21 is preferable, a film thickness such that the carbon atom inclusion amount is at $1/20$ of the maximum value is more preferable, a thickness such that the same is at $1/30$ is even more preferable, and it is particularly preferable to remove until a film thickness that exhibits a minimum value. Given such a range, there are hardly any fixed charges in the gate oxide film. That is, the principal components of the gate oxide film are made up of silicon atoms and oxygen atoms, similarly to an ordinary thermal oxide film formed on a silicon substrate. Therefore, a shift of the flat band voltage to the negative side is suppressed, and a CV characteristic similar to that of an ordinary silicon substrate is obtained.

Here, the distribution of carbon atoms in the oxide film shows similar trends to, for example, FIG. 2 within the above-described range. If the distribution of carbon atoms changes in accordance with thermal processing conditions, it is sufficient to evaluate the density of carbon atoms in the oxide film by, for example, SIMS and adjust the amount by suitable etching. If the film thickness of the gate oxide film is made too thin, the insulation breakdown voltage of the gate oxide film will be adversely affected. Therefore, an amount to be removed should be regulated with consideration of the thickness of the gate oxide film.

Figure 1D:
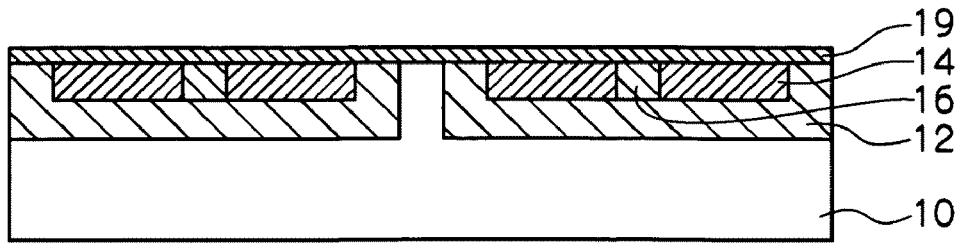

Third Step: A Step of Etching the First Oxide Film Thermally Processed in the Inactive Gas and Forming a Second Oxide Film Then, as shown in FIG. 1D, the oxide film to be removed by etching 21, in which the inclusion amount of carbon atoms is large, is removed to form the second gate oxide film 19. This etching is not particularly limited as long as the oxide film to be removed by etching 21 can be etched at a required rate, but may be, for example, etching utilizing an ammonium fluoride solution (buffered hydrofluoric acid, BHF).

An etching rate into the thermal oxide film of a BHF solution is around 30 nm/minute at room temperature. This etching rate is sensitive to concentrations of HF and $NH_4F$ in the BHF solution, which reach as much as several percent and over 10 percent, respectively, with respect to total weight of the BHF solution.

The film thickness of the oxide film after etching may be measured non-destructively and accurately in a short time using, for example, an ellipsometer, which is an optical film thickness measurement instrument.

Figure 1E:
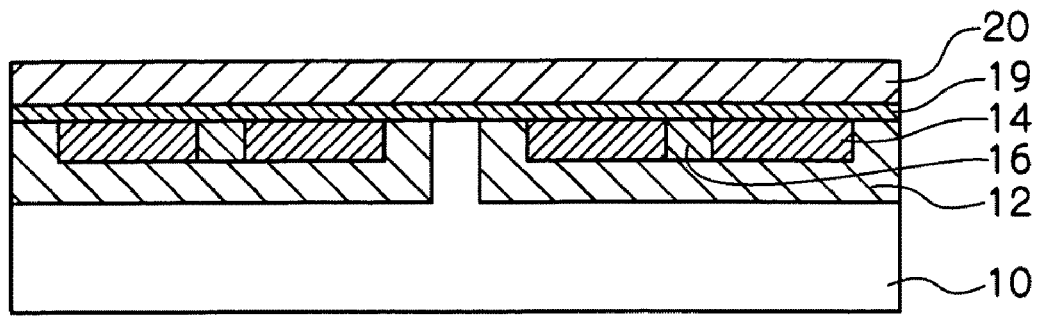
FIGS. 1E-1G are sectional process views of steps, of the semiconductor device fabrication method relating to the exemplary embodiment of the present invention, of forming a gate electrode layer and then forming an interlayer insulation film and contact holes.

Fourth Step: A Step of Forming a Gate Electrode on the Second Oxide Film and Performing Thermal Processing Lastly, as shown in FIG. 1E, the oxide film to be removed by etching 21 is etched and an N-type gate electrode layer 20 is formed on the second gate oxide film 19 that is left. The gate electrode layer 20 is constituted of polysilicon doped with phosphorus as a dopant at around $1 \times 10^{20}/cm^3$.

As the gate electrode layer 20, polysilicon, WSi, TiSi, NiSi, CoSi and the like can be mentioned. Particularly if polysilicon formed by using CVD (chemical vapor deposition) is employed, advantages that can be mentioned include the temperature of thermal processing for activation of the dopant being relatively low and there being no physical damage to the gate oxide film caused by a plasma CVD process, which is a CVD (chemical vapor deposition) process.

For a growth rate of the polysilicon of 200 nm/hour, conditions of formation of the gate electrode layer 20 are, for example, CVD growth being carried out at 500° C., 1000 sccm of monosilane $SiH_4$ gas flowing and 150 sccm of phosphene $PH_4$ gas flowing while about 5 SLM of $N_2$ flows as a carrier gas, and the reaction chamber pressure being kept under a reduced pressure of 10 Torr. In the present exemplary embodiment, 400 nm is grown over 2 hours.

Figure 1F:
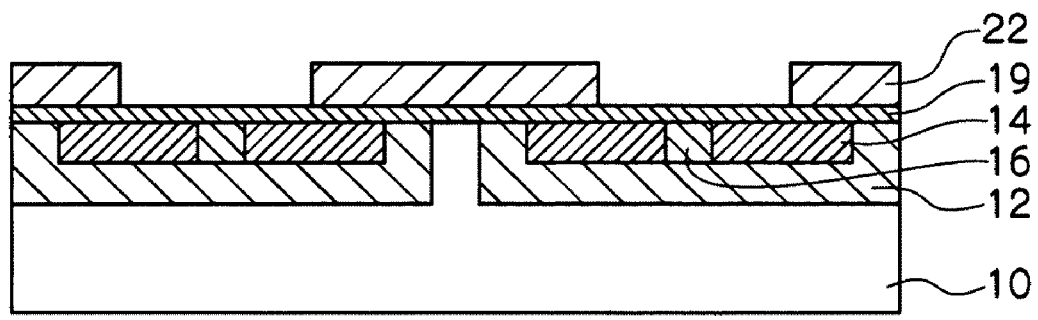

Thereafter, as shown in FIG. 1F, a gate electrode 22 is formed by publicly known photolithography and etching steps.

Thermal processing is carried out in order to activate the gate electrode 22 formed in this manner. A thermal processing atmosphere gas in this thermal processing may be an inactive gas, with a view to preventing oxidation of the gate electrode. The inactive gas is similar to the inactive gas of the earlier-described thermal processing of the oxide film.

In the present invention, the temperature of the thermal processing of the gate electrode 22 may be suitably adjusted in accordance with material properties of the gate electrode. For example, in the case of polysilicon, the temperature is preferably not less than 700° C. and not more than the thermal processing temperature in the second step. If the temperature is less than 700° C., the gate electrode 22 may not be activated, whereas if the temperature is higher than the thermal processing temperature in the second step, carbon may be newly segregated in the second gate oxide film 19, there may form fixed charges, and consequently the flat band voltage may shift to the negative side.

Here, the thermal processing for activating the gate electrode 22 may be applied to the gate electrode 22 after photolithography and etching as mentioned above, or may be applied to the gate electrode layer 20 before the photolithography and etching. Whichever time the gate electrode is activated, the gate electrode will be activated provided the thermal processing temperature is lowered relative to the thermal processing in the second step.

Figure 1G:
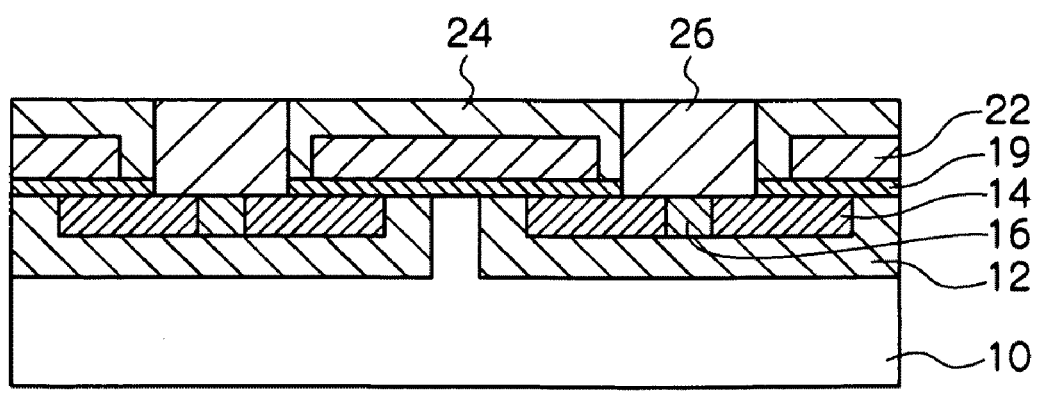

Finally, as in FIG. 1G, any exposed gate oxide film is removed by etching, an interlayer insulation film 24 is formed, and a contact hole 26 and wiring (not shown) are formed of, for example, aluminum or copper. Thus, the semiconductor device is fabricated.

-Substrate-

The semiconductor device fabricated by the semiconductor device fabrication method of the present invention may have a silicon substrate and may have a silicon carbide substrate, and carbon atoms left in the oxide film by the thermal processing have been removed as much as possible.

Of these, it is preferable to use a silicon carbide substrate with a view to a higher withstand voltage and operation at higher temperatures. As silicon carbides, for example, 2H—SiC, 3C—SiC, 4H—SiC, 6H—SiC, 8H—SiC, 10H—SiC, 15R—SiC and the like can be mentioned. These are shown in Ramsdell notation: the first number is a number of silicon carbide unit layers included in one unit of repetition in a stacking direction (c-axis direction), and the subsequent letter is C for a cubic crystal, H for a hexagonal crystal or R for a rhombohedral type. Of these silicon carbides, 4H—SiC, 6H—SiC and 15R—SiC are fabricated at higher temperatures, 2000° C. or above, and 3C—SiC may be fabricated at lower temperatures, 1800° C. or below. Of these, 3C—SiC has the highest speed of travel of electrons within the crystal (a saturation electron velocity 2.7 times that of silicon), and a crystal structure (cubic) similar to conventional silicon. Therefore, it is preferable to use 3C—SiC substrates with a view to fabrication of high-speed, high-efficiency, miniaturized devices, in addition to fabrication at a lower temperature being possible.

As a method of fabrication of a 3C—SiC substrate, in order to provide a low crystal defect density ($10/cm^2$ or less), a process of fabrication by heteroepitaxial growth using a CVD method on a substrate of silicon may be mentioned.

In the exemplary embodiment described above, an example has been illustrated in which an N-type conductive silicon carbide substrate doped with nitrogen is used. Similar effects may be expected from a P-type conductive silicon carbide substrate doped with boron, aluminum or the like.

-Evaluation of a Semiconductor Device Fabricated by the Fabrication Method of the Present Invention- A semiconductor device (MOS capacitor) fabricated as described above may have an amount of shift of the flat band voltage measured by evaluation of the CV characteristic. In order to evaluate the CV characteristic, after the gate electrode layer 20 has been formed in the above-mentioned fourth step, patterning of an electrode pad shape with a size of, for example, 100 μm by 200 μm is performed.

The flat band voltage obtained from the CV characteristic is affected by a work function of the electrode, interface states Qit formed at the interface between the silicon carbide substrate and the oxide film, fixed charges Qf in the oxide layer, and so forth.

Figure 3:
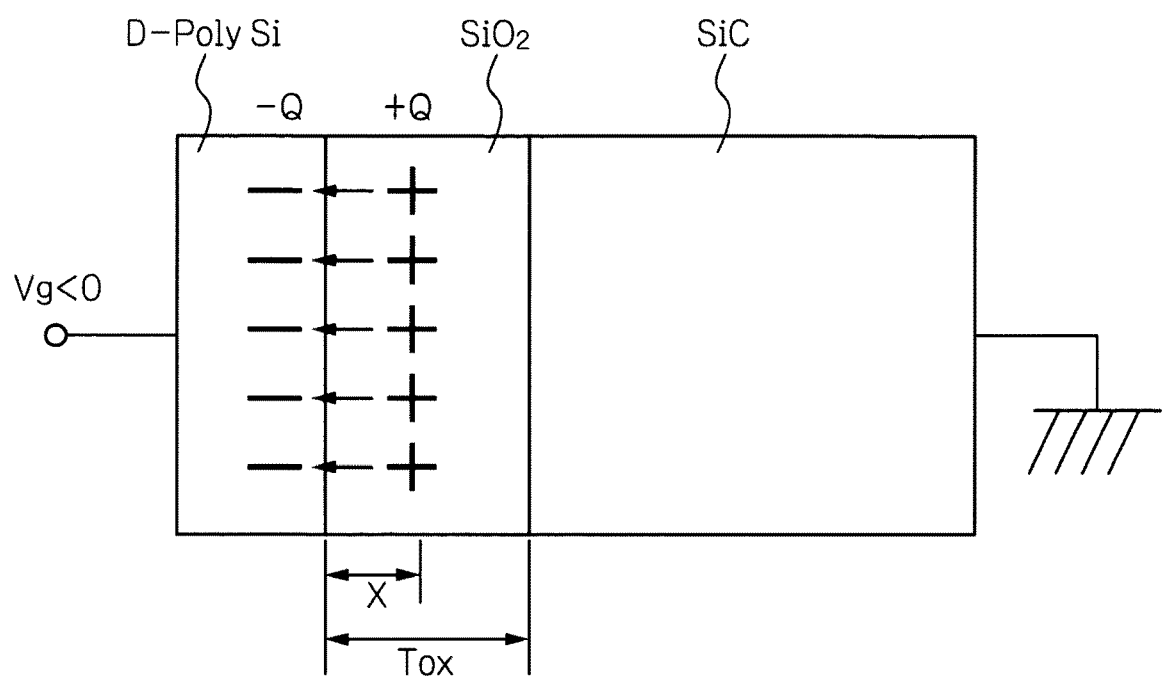
FIG. 3 is a schematic sectional view of a portion, of the semiconductor device of FIG. 2, at which consists of a gate electrode, a gate oxide film and a silicon carbide substrate.

Of these, the contribution to Vfb of the fixed charges Qf may be represented by the following equation (see FIG. 3).

$$Vfb = -Qf(Cox * Tox/X)$$

In this equation, Cox is the electrostatic capacitance of the gate oxide film, Tox is the film thickness of the gate oxide film, and X represents a distance from the interface with the polysilicon, and a region at which the carbon atoms in the gate oxide film segregate (hereinafter referred to where appropriate as a "position in the oxide film", which is equivalent to X in FIG. 2).

As shown in this equation, Vfb is dependent on the fixed charges Qf and the position X in the oxide film. Here, it is assumed that the fixed charges Qf can be trapped with a delta function-type depth distribution that is a very narrow region (within an extremely narrow range that does not feature a depth direction distribution). Given this assumption, provided it is possible for the fixed charges to be localized at the position of the interface between the gate electrode and the gate oxide film, for example, by thermal processing or the like, charges will not be generated at the silicon carbide substrate side, and X=0 in the above equation. Hence, it is expected that even if an increase in interface states occurs, the fixed charges Qf will have no effect on the flat band voltage.

In practice however, as is seen from the SIMS analysis results of FIG. 2, after the polysilicon electrode has been formed and activated, carbon atoms, which are the fixed charges, are left in the gate oxide film with a distribution of some depth. Therefore, for example, in the exemplary embodiment of the present invention as described above, of the oxide film in which the greater part of the carbon atoms are left, 20 nm in the substrate direction from the interface between the gate electrode and the oxide film is removed by etching. Thus, the effect on Vfb of the carbon atoms that are left is eliminated, and Vfb is not shifted.

Figure 4:
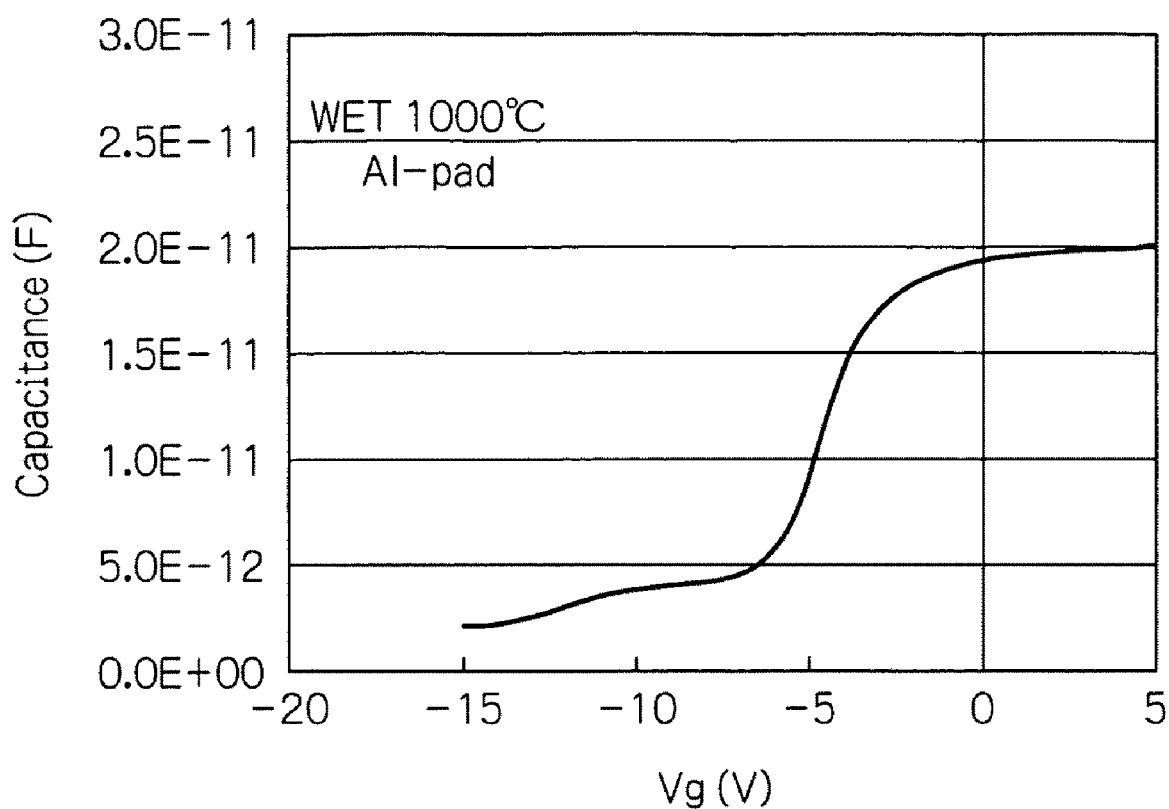
FIG. 4 is a graph showing a CV characteristic of a conventional semiconductor device (MOS capacitor), in which aluminum forms a gate electrode and the semiconductor device has not been subjected to thermal processing after gate electrode formation.
Figure 5:
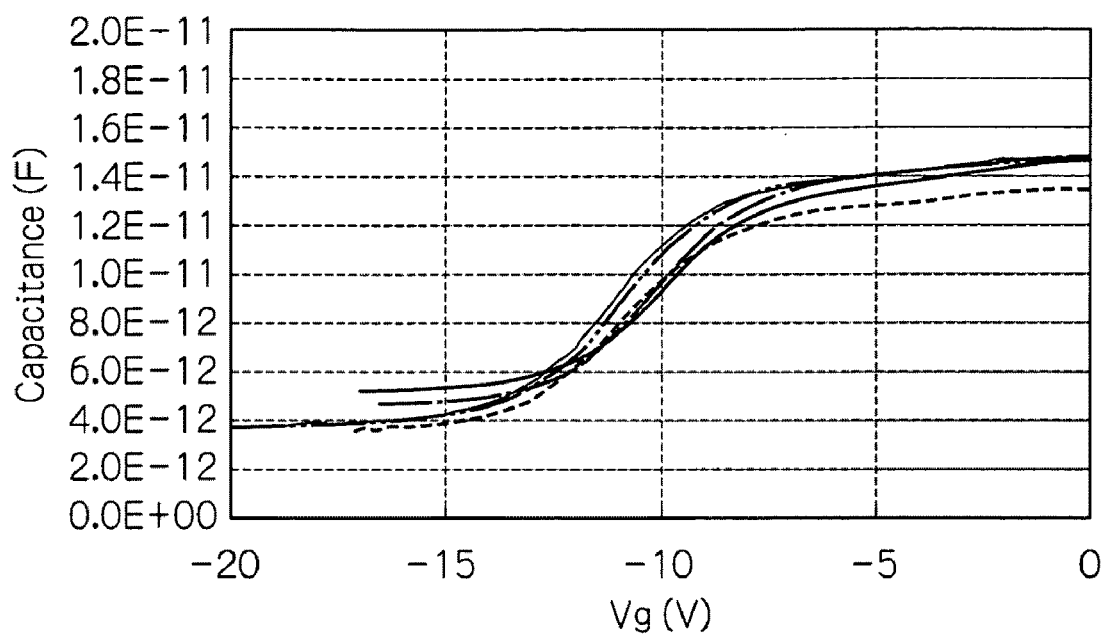
FIG. 5 is a graph showing CV characteristics of conventional semiconductor devices, in which polysilicon forms a gate electrode and, after gate electrode formation, the semiconductor device is subjected to thermal processing for activation for 20 minutes at 850° C. in an $N_2$ atmosphere.

According to such a process, the fixed charges in the gate oxide film are segregated by thermal processing after formation of the gate electrode (for example, the earlier-mentioned thermal processing for activating the polysilicon electrode). An effect of the shifting of the Vfb value of the CV characteristic being manifested is illustrated in FIG. 4 and FIG. 5. FIG. 4 is a graph showing a CV characteristic of a semiconductor device in which an aluminum electrode is formed by a process of vapor deposition of aluminum Al by a resistance heating system, in which physical damage is not caused by vapor deposition atoms, but is not then subjected to thermal processing. It is seen from FIG. 4 that Vfb=−3 V, which is relatively small. FIG. 5 meanwhile is a graph showing CV characteristics of semiconductor devices in which a polysilicon electrode is formed and then thermal processing is carried out for 20 minutes at 850° C. in an $N_2$ atmosphere in order to activate the polysilicon. It is seen from FIG. 5 that Vfb=−10 volts, which is greatly shifted to the negative side. From these results, the shift in Vfb is largely caused by thermal processing after gate electrode formation.

In contrast with these results, with the fabrication method of the present invention, the carbon atoms that segregate in the gate oxide layer before the gate electrode is formed are removed. Therefore, a large shift to the negative side of Vfb as in FIG. 5 may be suppressed. Moreover, when the temperature at which the gate oxide film is formed is set to a higher temperature than the temperature at which the gate electrode is thermally processed, segregation of the carbon atoms during the gate electrode formation may be suppressed.

Figure 6:
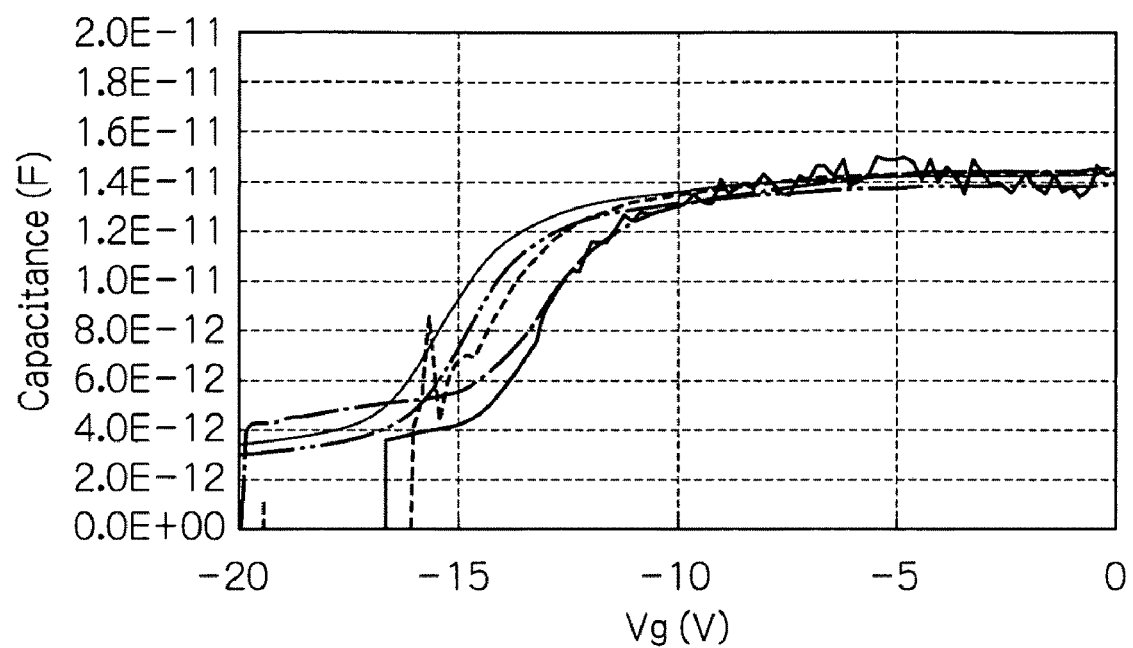
FIG. 6 is a graph showing results of evaluation of CV characteristics of semiconductor devices (MOS capacitors) fabricated by a conventional fabrication method.
Figure 7:
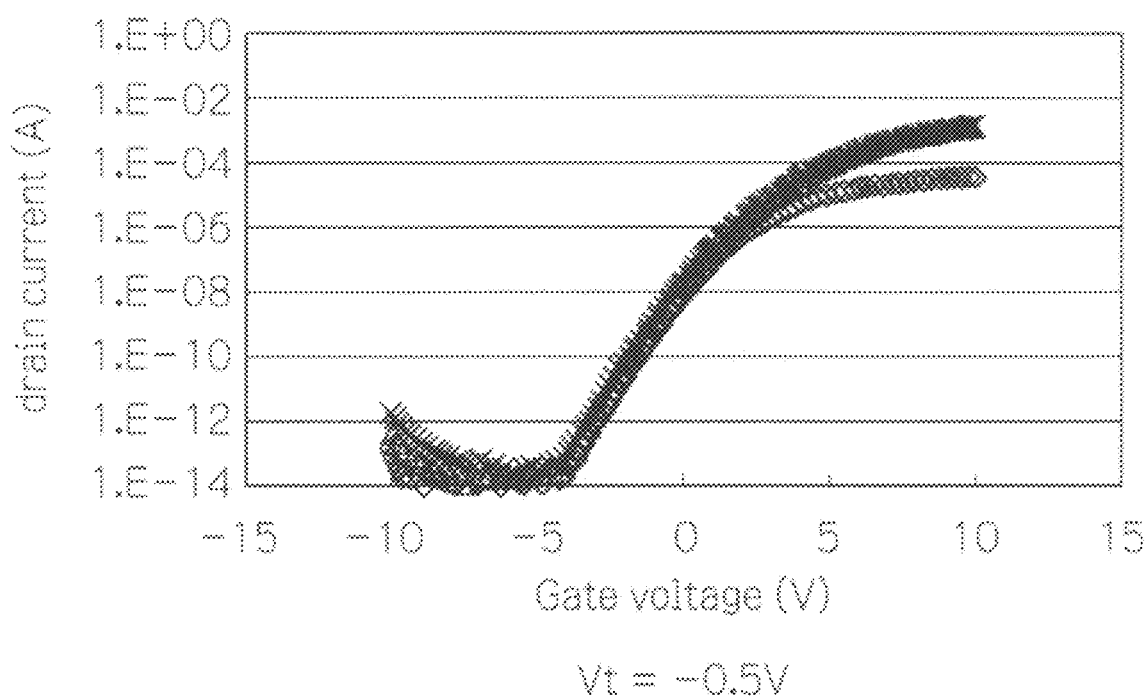
FIG. 7 is a graph showing results of evaluation of IV characteristics of semiconductor devices (lateral MOS) fabricated by a conventional fabrication method, which its oxidation of a gate oxide film is the same condition of MOS capacitor shown in FIG. 6.

Note that the small differences in Vfb in FIG. 5 and FIG. 6, are differences between samples.

What is claimed is:

1. A method of fabricating a semiconductor device, comprising:
    (i) forming, thermal oxidation, a first oxide film on a silicon carbide substrate;
    (ii) thermally processing the first oxide film in an inactive gas atmosphere;
    (iii) forming a second oxide film by etching the first oxide film, which has been thermally processed in the inactive gas, to a predetermined film thickness; and
    (iv) forming and thermally processing a gate electrode on the second oxide film,
    wherein a temperature of the thermal processing in (ii) is not less than a temperature of the thermal processing in (iv) and not more than a temperature of the silicon carbide substrate in (i).

2. The method according to claim 1, wherein the inactive gas comprises nitrogen gas.

3. The method according to claim 1, wherein the first oxide film comprises silicon dioxide obtained by thermal oxidization of the silicon carbide substrate.

4. The method according to claim 1, wherein said temperature of the thermal processing in (ii) and said temperature of the thermal processing in (iv) are thermal processing retention temperatures experienced by the silicon carbide substrate.

5. The method according to claim 1, wherein the predetermined film thickness of the first oxide film is set so that the first oxide film includes carbon atoms whose amount is at most 1/10 of a maximum value.

6. The method according to claim 1, wherein in the step (iv),
    the gate electrode is composed of polysilicon and
    the temperature of the thermal processing is greater than or equal to 700° C.

7. The method according to claim 1, further comprising:
    (v) after the step (iv), removing any exposed gate oxide film by etching; and
    (vi) after the step (v), forming an interlayer insulation film, a contact hole and wiring.

8. The method according to claim 1, wherein the silicon carbide substrate is either an N-type conductive silicon carbide substrate doped with nitrogen, a P-type conductive silicon carbide substrate doped with boron, or a P-type conductive silicon carbide substrate doped with aluminum.

9. The method according to claim 1, wherein the step (iv) further includes forming a gate electrode layer and forming the gate electrode by performing photolithography and etching steps on the gate electrode layer.

10. The method according to claim 8, wherein in the step (iv), the thermally processing the gate electrode is performed either before or after the photolithography and etching steps are performed.

11. A method of fabricating a semiconductor device, comprising:
    (i) forming, by thermal oxidation, a first oxide film on a substrate;
    (ii) thermally processing the first oxide film in an inactive gas atmosphere;
    (iii) forming a second oxide film by etching the first oxide film, which has been thermally processed in the inactive gas, to a predetermined film thickness; and
    (iv) forming and thermally processing a gate electrode on the second oxide film, wherein a temperature of the thermal processing in (ii) is not less than a temperature of the thermal processing in (iv) and not more than a temperature of the substrate in (i).

\* \* \* \* \*